(12) United States Patent
Kasai et al.

(10) Patent No.: US 8,572,462 B2
(45) Date of Patent: Oct. 29, 2013

(54) DECODING APPARATUS AND DECODING METHOD

(75) Inventors: Kenta Kasai, Tokyo (JP); Kohichi Sakaniwa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/486,044

(22) Filed: Jun. 1, 2012

(65) Prior Publication Data

US 2012/0284582 A1 Nov. 8, 2012

Related U.S. Application Data

(63) Continuation of application No. PCT/JP2010/059038, filed on May 27, 2010.

(30) Foreign Application Priority Data

Dec. 1, 2009 (JP) ................................ 2009-273720

(51) Int. Cl.
 *H03M 13/00* (2006.01)
(52) U.S. Cl.
 USPC ........................... 714/758; 714/786; 714/802
(58) Field of Classification Search
 USPC .................. 714/758, 786, 752, 760, 766, 802
 See application file for complete search history.

(56) References Cited

U.S. PATENT DOCUMENTS

| | | | | |
|---|---|---|---|---|
| 7,516,074 | B2 * | 4/2009 | Bilobrov | 704/270 |
| 7,603,607 | B2 * | 10/2009 | Maehata | 714/752 |
| 8,261,166 | B2 * | 9/2012 | Ulriksson | 714/786 |
| 8,335,964 | B2 * | 12/2012 | Yokokawa et al. | 714/758 |
| 2007/0226585 | A1 | 9/2007 | Park et al. | |

FOREIGN PATENT DOCUMENTS

| | | |
|---|---|---|
| EP | 1 826 910 A1 | 8/2007 |
| JP | 2007-228588 A | 9/2007 |

OTHER PUBLICATIONS

International Search Report mailed on Jul. 6, 2010, issued for International Application No. PCT/JP2010/059038, tiled May 27, 2010 (with English translation).
Kasai, Kenta, et al. "Fourier Domain Decoding Algorithm of LDPC codes for Parallel Implementations." The 32$^{nd}$ Symposium on Information Theory and its Application (SITA 2009). Yuda-Onsen, Yamaguchi, Japan, Dec. 1-4, 2009. W42-3, p. 270-274.
Declercq, David, et al. "Decoding Algorithms for Nonbinary LDPC Codes Over GF (q)." IEEE Transactions on Communicatios, 2007. 04, vol. 55, No. 4, p. 633-643.
Wymeersch, Henk, et al. "Log-Domain Decoding of LDPC Codes Over Gf (q)." 2004 IEEE International Conference on Communications, vol. 2, Jun. 2004. p. 772-776.
Mackay, David J.C. et al. "Evaluation of Gallager Codes for Short Block Length and High Rate Applications." IMA Workshop on Codes, Systems, and Graphical Models 1999. p. 1-21.

\* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

A decoding apparatus for performing decoding processing of encoded data by using non-binary LDPC codes, includes: a logarithmic Fourier transform processing section, a variable node processing section, an edge coefficient processing section, and a check node processing section, wherein the logarithmic Fourier transform processing section performs Fourier transform processing and logarithmization processing on a probability vector of a symbol of an encoded frame data to output an initial value of logarithmic Fourier domain probability vector, and the variable node processing section, the edge coefficient processing section, and the check node processing section perform iteration processing by using a logarithmic Fourier domain probability vector.

8 Claims, 4 Drawing Sheets

| Binary | 00 | 10 | 01 | 11 |
|---|---|---|---|---|
| Symbol | 0 | $\alpha$ | 1 | $\alpha^2$ |

⇓

Check Procession

$$\begin{bmatrix} 1 & \alpha & 0 \\ 1 & \alpha^2 & \alpha \end{bmatrix} \quad \begin{array}{l} \alpha \cdot 1 + 1 \cdot \alpha = 0 \\ \alpha \cdot 1 + 1 \cdot \alpha^2 + \alpha^2 \cdot \alpha = 0 \end{array}$$

DECODING APPARATUS AND DECODING METHOD

CROSS REFERENCE TO RELATED APPLICATION

This application is a continuation application of PCT/JP2010/059038 filed on May 27, 2010 and claims benefit of Japanese Application No. 2009-273720 filed in Japan on Dec. 1, 2009, the entire contents of which are incorporated herein by this reference.

FIELD

Embodiments herein relate generally to a decoding apparatus and a decoding method for decoding data which are encoded with non-binary LDPC codes.

BACKGROUND

Recently, LDPC (Low Density Parity Check) codes, which have been reported to achieve excellent performance approaching a Shannon limit, which is a theoretical limit of code performance, are used for cellular phones and wireless LANs, etc. as an error correcting code. While the LDPC codes being used in cellular phones etc. are binary LDPC codes, it is known that non-binary LDPC codes constructed over an extended Galois field have higher decoding performance than that of the binary LDPC codes for short code lengths not more than 10,000 bits, such as several hundreds to several thousands bits. In particular, the decoding processing of non-binary LDPC encoded data can be efficiently performed by using a SUM-PRODUCT algorithm (SPA) which allows the use of parallel calculation.

In the SPA decoding processing, multiplication processing at a variable node and convolution operation processing at a check node are repeated. However, since in the SPA decoding processing of non-binary LDPC codes, complex convolution operation processing needs to be performed at the check node which is at a higher order than that of the variable node, there has been a problem that the processing speed decreases.

While, for this purpose, an algorithm for performing convolution operation at high speed by using FFT (Fast Fourier Transform) has been proposed, the execution of the algorithm requires high operational accuracy. Moreover, an algorithm for approximating and simplifying the convolution operation processing at a check node is disclosed. However, even if this algorithm is used, the convolution operation processing at a check node is still time consuming processing, and increasing the processing speed has not been easy.

DETAILED DESCRIPTION

A decoding apparatus of an aspect of the present invention is a decoding apparatus for performing decoding processing of encoded frame data which are encoded by using non-binary low density parity check codes, comprising: a logarithmic Fourier transform processing section configured to perform Fourier transform processing and logarithmization processing on a probability vector of a symbol of the encoded frame data, and to output an initial value of a logarithmic Fourier domain probability vector; a variable node processing section configured to execute variable node processing by convolution operation using the initial value of the logarithmic Fourier domain probability vector and a fourth message outputted from an edge coefficient processing section to compute a first message, and to update and output the logarithmic Fourier domain probability vector; the edge coefficient processing section configured to execute edge coefficient processing on the first message to compute a second message, and to execute edge inverse coefficient processing on a third message inputted from a check node processing section to compute the fourth message; and the check node processing section configured to execute check node processing by addition operation on the second message to compute the third message.

A decoding method of another aspect of the present invention is a decoding method for performing decoding processing of encoded frame data which is encoded by using non-binary low density parity check codes, comprising: logarithmic Fourier transform processing; variable node processing; edge coefficient processing; and check node processing, wherein the logarithmic Fourier transform processing comprises performing Fourier transform processing and logarithmization processing on a probability vector of a symbol of an encoded frame data to compute an initial value of a logarithmic Fourier domain probability vector; the variable node processing comprises executing variable node processing by convolution operation using the logarithmic Fourier domain probability vector and a fourth message outputted from the check node processing to compute a first message and update the logarithmic Fourier domain probability vector; the edge coefficient processing comprises executing edge coefficient processing on the first message to compute a second message, and to execute edge inverse coefficient processing on a third message to compute the fourth message; and the check node processing comprises executing check node processing by addition operation on the second message to compute the third message.

<Non-Binary LDPC Codes>

Figures 1, 2:
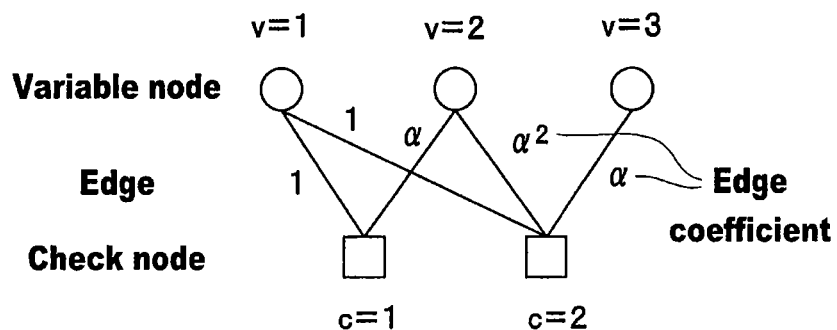
FIG. 1 is an explanatory diagram to illustrate non-binary LDPC codes.
FIG. 2 is a Tanner graph to graphically represent a parity check matrix of non-binary LDPC codes.

First, non-binary LDPC codes will be briefly described. FIG. 1 shows a parity check matrix of two rows and three columns of non-binary LDPC codes for an extended Galois field GF (4), that is, in the case of size 4. In non-binary LDPC codes, processing is performed for each symbol, which consists of a plurality of bits, as a unit. For example, in non-binary LDPC codes of GF(4), decoding processing of binary representations (00), (10), (01), and (11) is performed as being four symbols 0, $\alpha$, 1 and $\alpha 2$, respectively. Each row in the check matrix represents a parity check equation, and a data frame is configured such that the sum of products of a check equation becomes 0 as shown in FIG. 1. For this reason, if an error has occurred in a decoded data frame, the constraint of the check equation is used to perform correction processing. Note that it is preferable to use an extended Galois field such as GF(64), GF(128) or GF(256) in a decoding apparatus 100.

Next, FIG. 2 shows a Tanner graph that graphically represents the parity check matrix shown in FIG. 1. In the SPA, decoding processing is performed by an iteration processing in which exchange of message is repeated between a variable node and a check node while edge coefficient processing is performed.

<First Embodiment>

Figure 3:
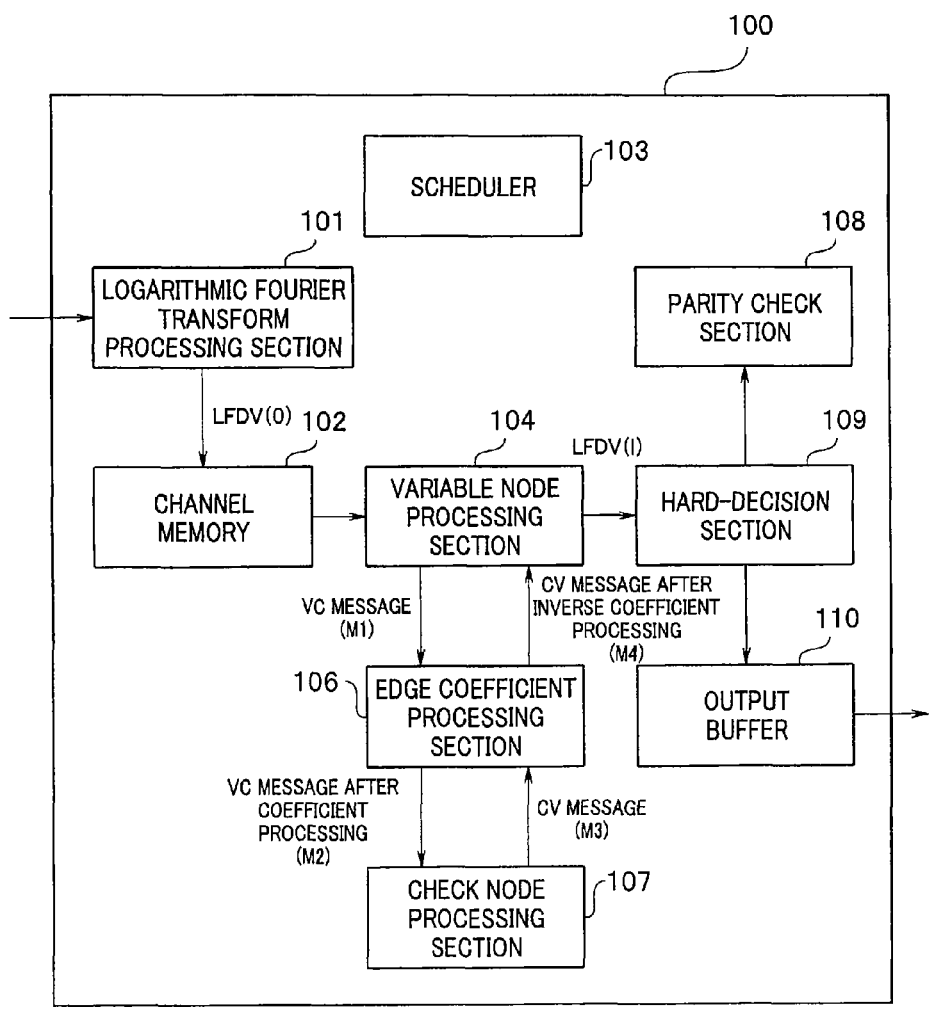
FIG. 3 is a block diagram of a decoding apparatus of a first embodiment.

Next, a general configuration of a decoding apparatus 100 of a first embodiment of the present invention will be described by using FIG. 3. As shown in FIG. 3, the decoding apparatus 100 of the present embodiment includes a logarithmic Fourier transform processing section 101, a channel value memory 102, a scheduler 103, a variable node processing section 104, an edge coefficient processing section 106, a check node processing section 107, a parity check section 108, a hard-decision section 109, and an output buffer 110.

Here, LFDV represents a logarithmic Fourier domain probability vector. The message that is outputted to the edge coefficient processing section 106 by the variable node processing section 104 is a VC message, which is a first message M1, and the message that is outputted to the check node processing section 107 by the edge coefficient processing section 106 is a VC message after coefficient processing, which is a second message M2. Moreover, the message that is outputted to the edge coefficient processing section 106 by the check node processing section 107 is a CV message, which is a third message M3, and the message that is outputted to the variable node processing section 104 by the edge coefficient processing section 106 is a CV message after inverse coefficient processing, which is a fourth message M4. It is noted that the specific method for computing each message will be described later in detail. Moreover, since the LFDV and the message change according to the number of processing, the number of processing is shown in parentheses as in (1) at the end as desired. For example, LFDV(0) refers to an initial value of logarithmic Fourier domain probability vector.

The above described components that constitute the decoding apparatus 100 are electric circuits, etc., which are not necessarily physically independent components and may be, for example, packaged in one chip. Moreover, the functions of the above described components may be implemented by FW (firmware) which is operated by a general-purpose CPU. Further, the decoding apparatus 100 preferably includes a storage section, such as a first message memory that temporarily stores a message between the variable node processing section 104 and the edge coefficient processing section 106, a second message memory that temporarily stores a message between the check node processing section 107 and the edge coefficient processing section 106, and the like.

The scheduler 103 performs the control of the entire decoding apparatus 100. To be specific, the scheduler 103 notifies the execution of processing to the variable node processing section 104, the edge coefficient processing section 106, and the check node processing section 107, and notifies the channel value memory 102 to output necessary data in accordance with the timing of processing of the variable node processing section 104. Further, the scheduler 103 judges the end of decoding processing from a parity check result inputted from the parity check section 108, or the number of repetition of decoding (the number of iterations), and when the decoding processing ends, notifies the output buffer 110 to output the decoded result to a signal processing section in a later stage not shown.

The channel value memory 102, which is a temporary storage section, holds an initial value of LFDV, LFDV(0), inputted from the logarithmic Fourier transform processing section 101 while the iteration processing is performed. LFDV(0) held by the channel value memory 102 is outputted at least one or more times according to the processing of the variable node processing section 104.

Figure 4:
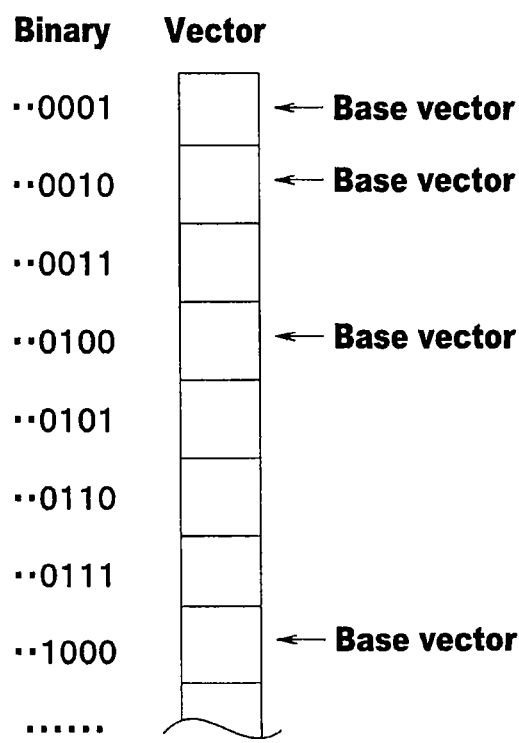
FIG. 4 is an explanatory diagram to illustrate a base vector.

The hard-decision section 109 performs positive/negative decision for the value of the index referring to the base vector for each bit in LFDV(1) of the code data frame inputted from the variable node processing section 104, and outputs hard-decision data by deciding it to be 0 when positive and 1 when negative. Here, a base vector refers to a vector in which there is only one "1" in a binary sequence as shown in FIG. 4. The hard-decision result is outputted to the parity check section 108 and the output buffer 110, and the output buffer 110 temporarily stores the hard-decision data, and outputs the hard-decision data, which is the decoding result, according to a notification from the scheduler 103.

The parity check section 108 performs parity check on whether or not the hard-decision data inputted from the hard-decision section 109 satisfies the parity check equation of the non-binary LDPC codes, and outputs the result thereof to the scheduler 103.

A probability vector, "p_v(x)", of each symbol included in the code data frame is inputted to the logarithmic Fourier transform processing section 101 from a signal processing section not shown. The logarithmic Fourier transform processing section 101 performs Fourier transform processing on inputted probability vector, "p_v(x)", and further performs logarithmization processing (the base is natural logarithmic value) thereon, to output an initial value (LFDV(0)) of logarithmic Fourier domain probability vector (LFDV), "ln(p_v(z))", to the channel value memory 102.

That is, the logarithmic Fourier transform processing section 101 performs Fourier transform processing and logarithmization processing on a probability vector, "p_v(x)", of a symbol of the encoded frame data and outputs an initial value LFDV(0) of the logarithmic Fourier domain probability vector.

While, normally, the Fourier transform processing is performed on complex numbers, since the symbol of non-binary LDPC codes is a Galois field, the Fourier transform processing performed by the logarithmic Fourier transform processing section 101 is executed only by addition and subtraction. Hereafter, Equation 1, which is the conversion formula thereof, will be shown.

$$P_v(z) = \sum_{x \in GF(q)} p_v(x)(-1)^{x \cdot z} \qquad \text{(Equation 1)}$$

In Equation 1 described above, "p_v(x)" represents a probability vector of a symbol v, and the length of this probability vector will become "q" which is equal to the number of elements of the Galois field GR(q). Moreover, "x·z" represents an inner product between binary vectors in which the index number is binary expanded. When the size of the Galois field is a power of two, since the Fourier transform processing can be recursively executed, a Fast Fourier Transform algorithm known as a butterfly operation can be used. Further, since the value after Fourier transform may become negative, an equation extended to complex numbers, as given by the following equation, is used as the logarithmic conversion formula.

$$\ln(x) := \exp^{-1}(|x|) + \arg(x)\sqrt{-1} \qquad \text{(Equation 2)}$$

$$\arg(x) := \begin{cases} 0 & (x > 0) \\ \pi & (x < 0) \end{cases} \qquad \text{(Equation 3)}$$

The variable node processing section 104 executes variable node processing according to the parity check equation of a designated column index of a parity check matrix by using LFDV(0), "lnPv(z)", inputted from the channel value memory 102 and a CV message after inverse coefficient processing, M4(1), "Λ^(1)_cv", inputted from the edge coefficient processing section 106, according to the execution notification of the variable node processing inputted from the scheduler 103, to calculate a VC message, "Λ^(1)_vc", which is the first message M1(1), and LFDV(1), "Λ^(1)_v".

That is, the variable node processing section 104 executes variable node processing by convolution operation using a logarithmic Fourier domain probability vector LFDV(0) and a fourth message M4(1), to compute a first message M1 and a logarithmic Fourier domain probability vector LFDV(1). In other words, the variable node processing section 104 updates the logarithmic Fourier domain probability vector LFDV(1) by using the logarithmic Fourier domain probability vector LFDV(0) and the fourth message M4(1).

Equation 4 for computing a VC message, "Λ^(1)_vc", is shown below.

$$\Lambda_{vc}^{(l)}(z) = \ln P_v(z) \boxtimes_{c' \in V_c \backslash [c]} \Lambda_{c'v}^{(l)}(z) \quad \text{(Equation 4)}$$

Where, "Λ^(1)_c'v" represents the CV message after inverse coefficient processing, M4(1), inputted from the edge coefficient processing section 106. "V_c\c" represents a subset of row indexes excluding "c" out of a set "V_c", and "1" represents the number of repetition. It is noted that "Λ^(0)_vc" at the start of decoding is supposed to be "lnPv(z)".

Further, $$\boxtimes \quad \text{(Equation 5)}$$

represents the convolution operation defined by the following Equation 6.

$$(\lambda_1 \boxtimes \lambda_2)(x) = \ln (\Sigma_{y,z \in GF(q): x=y+z} e^{\lambda_1(y)+\lambda_2(z)}) \quad \text{(Equation 6)}$$

Further, LFDV(1), "Λ^(1)_v", is calculated by the following Equation 7.

$$\Lambda_v^{(l)}(z) = \ln P_v(z) \boxtimes_{c \in V_c} \Lambda_{cv}^{(l)(z)} \quad \text{(Equation 7)}$$

The edge coefficient processing section 106 performs coefficient processing on the VC message M1(1) inputted from the variable node processing section 104 with an edge coefficient, "α_vc", to compute a VC message after coefficient processing, M2(1), and output it to the check node processing section 107. Moreover, the edge coefficient processing section 106 performs inverse coefficient processing with edge coefficient "α_vc" on a CV message M3(1) inputted from the check node processing section 107, to output a CV message after inverse coefficient processing, M4(1), to the variable node processing section 104.

That is, the edge coefficient processing section 106 executes edge coefficient processing on the first message M1 to compute the second message M2, and executes edge inverse coefficient processing on the third message M3 to compute the fourth message M4.

First, Equation 8 for computing the VC message after coefficient processing, M2(1), is shown below.

$$\tilde{\Lambda}_{vc}^{(l)} = \Lambda_{vc}^{(l)}(zA^T(\alpha_{vc})) \quad \text{(Equation 8)}$$

Where, A(α) is a binary matrix corresponding to a coefficient α, and is given by the following Equation 9.

$$A(\alpha) = \begin{pmatrix} \alpha e_1 \\ \vdots \\ \alpha e_m \end{pmatrix} \quad \text{(Equation 9)}$$

Further, "e_i" is a binary base vector in which only the i-th bit is 1.

Next, the inverse coefficient processing for computing a CV message after inverse coefficient processing, M4(1), is shown below.

$$\Lambda_{cv}^{(l)}(z) = \tilde{\Lambda}_{cv}^{(l)}(zA^T(\alpha_{vc}^{-1})) \quad \text{(Equation 10)}$$

In the decoding processing of a known non-binary LDPC codes in which the processing of probability vector by logarithmic Fourier transform processing is not performed, inverse coefficient processing can be performed by a simple inverse operation of coefficient processing. However, in a decoding method utilizing the algorithm of the present invention, the computing processing of (Equation 10) needs to be executed. It is noted that the inverse coefficient processing can be replaced with a simple inverse operation processing equivalent to a conventional processing by modifying the coefficient matrix into one in which the coefficients at the time of coding are transposed.

The check node processing section 107 computes a CV message M3(1+1), by using the VC message after coefficient processing, M2(1), inputted from the edge coefficient processing section 106. That is, the check node processing section 107 executes check node processing by addition operation on the second message M2 to compute the third message M3.

To be specific, the check node processing section 107 performs addition operation shown by Equation 11 below.

$$\tilde{\Lambda}_{cv}^{(l+1)}(z) = \sum_{v' \in V_c \backslash \{v\}} \tilde{\Lambda}_{v'c}^{(l)}(z) \; \forall z \in GF(q) \quad \text{(Equation 11)}$$

As so far described, since the load of the check node processing is small in the decoding apparatus 100 and decoding method of the present embodiment, the processing speed is high.

That is, in a conventional decoding apparatus of non-binary LDPC codes, since convolution operation as shown in (Equation 5) is performed in the check node processing in which the number of order (number of terms) is large, the load of check node processing has been large. In contrast to this, in the decoding apparatus 100 and the decoding method of the present embodiment, since the check node processing is not convolution operation but addition operation, the load of the check node processing is small, and the processing speed is high.

It is noted that as the hard-decision method of the hard-decision section 109, it is of course possible to perform not only the above described method, but also hard-decision in a probability vector domain, which has been used in the decoding processing of conventional non-binary LDPC codes. When hard-decision is performed in a probability vector domain, inverse logarithmic Fourier transform processing is performed on LFDV(1) to compute a posterior probability vector, and hard-decision is made on a symbol at which the posterior probability vector becomes maximum.

Next, the action of the decoding apparatus 100 of the present embodiment will be described along the flow of processing.

<Probability Vector Input Processing Step>

A probability vector "p_v(x)" of each symbol of code data frame is inputted to the decoding apparatus 100 from the signal processing section in a previous stage not shown.

<Logarithmic Fourier Transform Processing Step>

The probability vector "p_v(x)" of each symbol of the encoded frame data which is inputted to the decoding apparatus 100 is successively subjected to logarithmic Fourier transform (Fourier transform and logarithmization) at the logarithmic Fourier transform processing section 101 and is stored in the channel value memory 102. It is noted that the initial value LFDV(0) of the probability vector which has undergone logarithmic Fourier transform, "ln(P_v(z))", is held at the channel value memory 102 while decoding processing is performed.

When all LFDVs(0) of the code data frame are inputted to the channel value memory 102, decoding processing is started according to the instruction of the scheduler 103, and LFDV(0) is outputted to the variable node processing section 104.

<Initialization Processing Step>

In the variable node processing section 104, the VC message M1 is initialized by using LFDV(0). It is noted that in the following description, description will be made by taking example of the case of iteration number (1).

<Coefficient Processing Step>

The VC message M1(1) outputted from the variable node processing section 104 is subjected to coefficient processing at the edge coefficient processing section 106 so that a VC message after coefficient processing, M2(1), is computed.

<Check Node Processing Step>

The check node processing section 107 performs the check node processing shown by (Equation 9) by using the VC message M2(1) outputted from the edge coefficient processing section 106 to compute a CV message M3(1+1). In this occasion, although the check node processing section 107 may successively perform the processing of each check node, it is preferable to process in paralleled a plurality of check node processing. Parallel processing makes the processing speed faster. Further, it is more preferable for the check node processing section 107 to process in parallel the processing of all the check nodes at the same time.

<Inverse Coefficient Processing Step>

The CV message M3(1+1) outputted from the check node processing section 107 is subjected to inverse coefficient processing at the edge coefficient processing section 106 so that a CV message after inverse coefficient processing, M4(1+1), is computed.

<Variable Node Processing Step>

The variable node processing shown in (Equation 4) and (Equation 7) are performed at the variable node processing section 104 so that LFDV(1+1) is computed.

<Hard-decision Processing Step>

Hard-decision is performed on LFDV(1+1) outputted from the variable node processing section 104 at the hard-decision section 109, and a hard-decision result, that is, hard-decision data is computed and outputted to the parity check section 108 and the output buffer 110.

<Parity Check Processing Step>

The parity check section 108 performs parity check based on the hard-decision data.

<End of Decoding Processing?>

When all the parity check equations are satisfied at parity check, it means that decoding processing is completed without error. Then, the scheduler 103 ends the decoding processing, and instructs the output buffer 110 to output the hard-decision data.

When the parity check equation is not satisfied at the parity check, iteration processing which is a series of the above described processing is repeatedly performed based on the VC message M1(1+1) obtained by (Equation 4).

A maximum number Lmax is predetermined for the number of repetition of the iteration processing (the number of iterations), and when the maximum number Lmax is exceeded, the scheduler 103 stops decoding processing even if the parity check equation is not satisfied at parity check, and outputs the hard-decision result of the output buffer 110 to the signal processing section in a later stage. Alternatively, the scheduler 103 outputs an error signal.

It is noted that when it is known before starting the processing that the number of repetition needed until the decoding processing is completed is large, the parity check section 108 may perform parity check at only a predetermined number of iterations, or at an interval of a predetermined number of iterations without performing it at every iteration processing.

It is noted as already described, the number of iterations refers to a number of times at which one cycle of the variable node processing by the variable node processing section, the edge inverse coefficient processing by the edge coefficient processing section, and the check node processing by the check node processing section are performed.

As so far described, in the decoding method of the present embodiment, a Fourier domain SPA, which is equivalent to a conventional probability domain SPA, is used in the parallel decoding calculation of non-binary LDPC codes. For this reason, the problem of processing delay is solved by arranging that the convolution operation at the check node processing which has been a bottle neck in the decoding processing in the probability domain SPA is performed by the check node processing in which messages are not concentrated.

That is, since in the decoding method of the present embodiment, it is possible to replace the convolution operation in the check node processing which has been a problem in conventional decoding apparatuses with addition processing, thereby performing the processing by SPA by subjecting an inputted probability vector to logarithmic Fourier transform and performing the decoding processing in a logarithmic Fourier domain, the processing speed of the decoding processing can be increased.

<Second Embodiment>

Next, a decoding apparatus 100A and a decoding method of a second embodiment of the present invention will be described. Since the decoding apparatus 100A and the decoding method of the present embodiment are similar to the decoding apparatus 100 and the decoding method of the first embodiment, like reference characters are given to like components, thereby omitting the description thereof.

Figure 5:
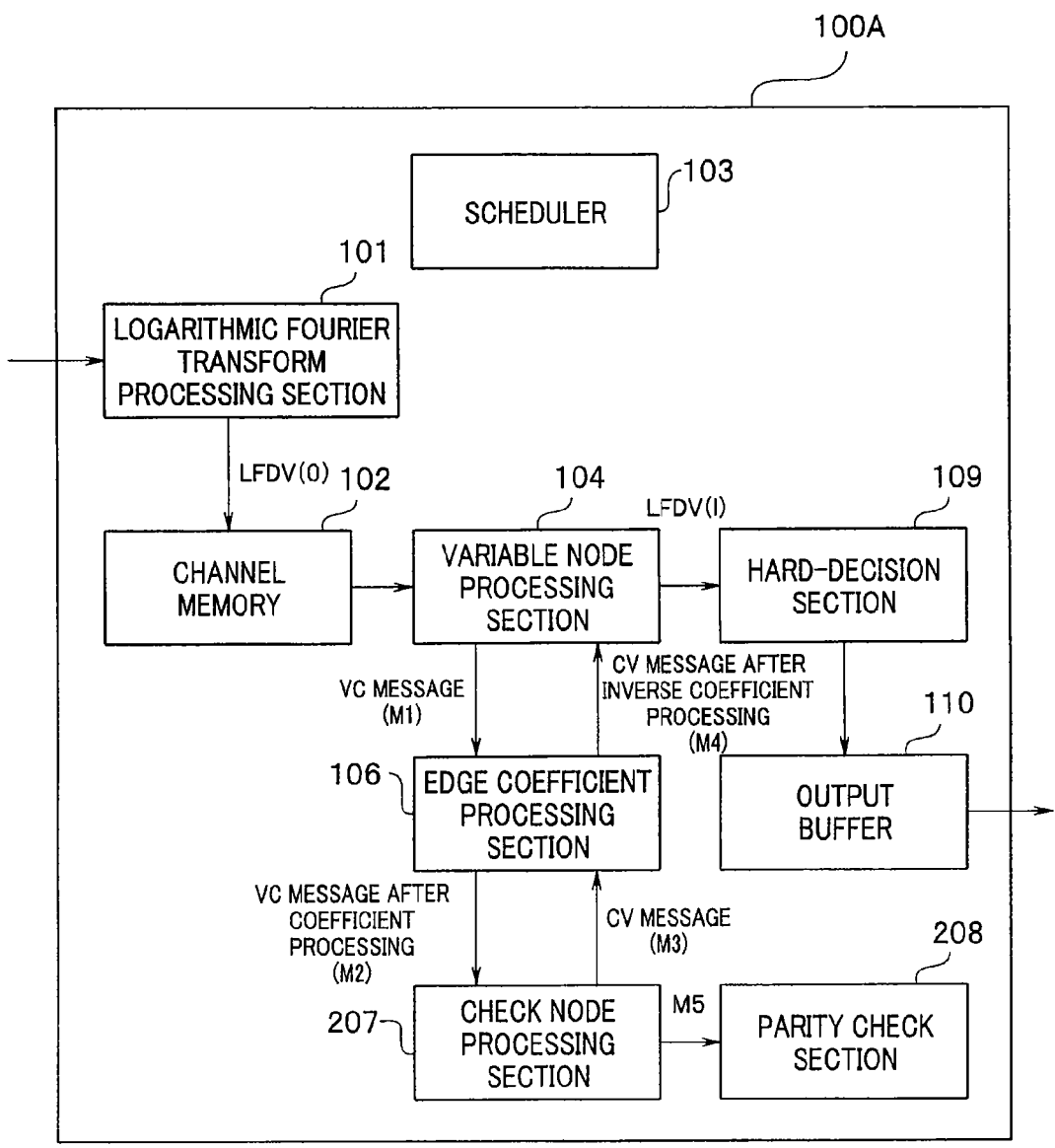
FIG. 5 is a block diagram of a decoding apparatus of a second embodiment.

As shown in FIG. 5, the decoding apparatus 100A of the present embodiment differs in the check node processing section 207 and the parity check section 208 from the decoding apparatus 100 of the first embodiment.

The check node processing section 207 performs computing processing of a total sum vector M5 of the third message M3 shown in the following (Equation 12), concurrently with the check node processing shown in (Equation 10). Then, the parity check section 208 performs parity check by performing hard-decision of the base vector of the total sum vector M5 of the third message M3 obtained in (Equation 12).

$$\tilde{\lambda}_c^{(l+1)}(z) = \sum_{v' \in V_c} \tilde{\lambda}_{vc}^{(l)}(z) \ \forall z \in GF(q) \quad \text{(Equation 12)}$$

That is, in the decoding apparatus 100A and the decoding method of the present embodiment, the parity check section 208 performs parity check by performing sign decision of the base vector of total sum vector M5 of the third message M3 outputted from the check node processing section 207.

Here, the computation of (Equation 10) can be performed by first computing the total sum vector M5, and removing the message to one variable node "c" from the total sum vector M5. For this reason, by using the total sum vector M5 which has been computed in the computing process of (Equation 10), it is made possible to perform parity check without newly performing the computing of (Equation 12) in the decoding apparatus 100A.

The decoding apparatus 100A and the decoding method of the present embodiment has the same effects as those of the decoding apparatus 100 and the decoding method of the first embodiment, and moreover has a higher processing speed.

It is noted that the present invention is applicable to any system provided if it is a system that uses a non-binary LDPC codes. For example, it is usable in the range from communication systems, and broadcasting systems to various storage systems such as magnetic recording systems, optical disk systems, and further semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding apparatus for performing decoding processing of encoded frame data which are encoded by using non-binary low density parity check codes, comprising:
a logarithmic Fourier transform processing section configured to perform Fourier transform processing and logarithmization processing on a probability vector of a symbol of the encoded frame data, and to output an initial value of a logarithmic Fourier domain probability vector;
a variable node processing section configured to execute variable node processing by convolution operation using the initial value of the logarithmic Fourier domain probability vector and a fourth message outputted from an edge coefficient processing section to compute a first message, and to update and output the logarithmic Fourier domain probability vector;
the edge coefficient processing section configured to execute edge coefficient processing on the first message to compute a second message, and to execute edge inverse coefficient processing on a third message inputted from a check node processing section to compute the fourth message; and
the check node processing section configured to execute check node processing by addition operation on the second message to compute the third message.

2. The decoding apparatus according to claim 1, further comprising:
a hard-decision section configured to perform hard-decision by sign decision of a base vector of the logarithmic Fourier domain probability vector.

3. The decoding apparatus according to claim 2, further comprising:
a parity check section configured to perform parity check by performing sign decision of a base vector of a total sum vector of the third message.

4. The decoding apparatus according to claim 3, wherein the parity check section performs the parity check at only a predetermined number of iterations, or at an interval of a predetermined number of iterations.

5. A decoding method for performing decoding processing of encoded frame data which is encoded by using non-binary low density parity check codes, comprising:
logarithmic Fourier transform processing executed in a processor;
variable node processing executed in a processor;
edge coefficient processing executed in a processor; and
check node processing executed in a processor, wherein
the logarithmic Fourier transform processing comprises performing Fourier transform processing and logarithmization processing on a probability vector of a symbol of the encoded frame data to compute an initial value of a logarithmic Fourier domain probability vector,
the variable node processing comprises executing variable node processing by convolution operation using the logarithmic Fourier domain probability vector and a fourth message outputted from the edge coefficient processing to compute a first message and update the logarithmic Fourier domain probability vector,
the edge coefficient processing comprises executing edge coefficient processing on the first message to compute a second message, and to execute edge inverse coefficient processing on a third message to compute the fourth message, and
the check node processing comprises executing check node processing by addition operation on the second message to compute the third message.

6. The decoding method according to claim 5, further comprising:
hard-decision processing configured to perform hard-decision by sign decision of a base vector of the logarithmic Fourier domain probability vector.

7. The decoding method according to claim 6, further comprising:
parity check processing configured to perform parity check by performing sign decision of a base vector of a total sum vector of the third message.

8. The decoding method according to claim 7, wherein the parity check is performed only at a predetermined number of iterations, or at an interval of a predetermined number of iterations.

* * * * *